United States Patent
Fujieda et al.

(10) Patent No.: US 8,802,963 B2
(45) Date of Patent: Aug. 12, 2014

(54) THERMOELECTRIC CONVERSION MATERIAL

(75) Inventors: Tadashi Fujieda, Mito (JP); Takashi Naito, Funabashi (JP); Takuya Aoyagi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 245 days.

(21) Appl. No.: 13/335,114

(22) Filed: Dec. 22, 2011

(65) Prior Publication Data

US 2012/0161273 A1 Jun. 28, 2012

(30) Foreign Application Priority Data

Dec. 24, 2010 (JP) ................. 2010-286922

(51) Int. Cl.
*H01L 35/28* (2006.01)
*H01L 35/30* (2006.01)
*H01L 35/18* (2006.01)
*H01L 35/22* (2006.01)
*H01L 35/00* (2006.01)

(52) U.S. Cl.
CPC ............. *H01L 35/18* (2013.01); *H01L 35/22* (2013.01); *H01L 35/00* (2013.01); *Y10S 257/93* (2013.01)
USPC ........... 136/205; 136/208; 136/211; 136/212; 257/43; 257/467; 257/615; 257/616; 257/930; 257/E27.008; 257/E29.347

(58) Field of Classification Search
CPC .......... H01L 35/00; H01L 35/18; H01L 35/22
USPC ............ 136/205, 208, 211, 212; 257/43, 467, 257/615, 616, 930, E27.008, E29.347
See application file for complete search history.

(56) References Cited

U.S. PATENT DOCUMENTS

| 5,453,337 A | 9/1995 | Willmann et al. |
| 8,465,998 B2 * | 6/2013 | Sasaki et al. ............ 438/54 |

(Continued)

FOREIGN PATENT DOCUMENTS

| DE | 10 2008 057 615 B3 | 12/2009 |
| GB | 782756 | 9/1957 |

(Continued)

OTHER PUBLICATIONS

EP Search Report of Appln. No. 11194975.6 dated Jul. 19, 2012 in English.

(Continued)

*Primary Examiner* — Dao V Nguyen
(74) *Attorney, Agent, or Firm* — Antonelli, Terry, Stout & Kraus, LLP.

(57) ABSTRACT

A thermoelectric conversion material is provided, in which only a desired crystal is selectively precipitated. An $M_xV_2O_5$ crystal is selectively precipitated in vanadium-based glass, wherein M is one metal element selected from the group consisting of iron, arsenic, antimony, bismuth, tungsten, molybdenum, manganese, nickel, copper, silver, an alkali metal and an alkaline earth metal, and $0<x<1$.

17 Claims, 3 Drawing Sheets

(56) References Cited

U.S. PATENT DOCUMENTS

| | | | |
|---|---|---|---|
| 2001/0054549 A1 | 12/2001 | Park et al. | |
| 2006/0118159 A1* | 6/2006 | Tsuneoka et al. | 136/211 |
| 2006/0177664 A1 | 8/2006 | Naitou et al. | |
| 2010/0258156 A1* | 10/2010 | Inatomi et al. | 136/205 |
| 2013/0126864 A1* | 5/2013 | Fujieda et al. | 257/43 |

FOREIGN PATENT DOCUMENTS

| | | |
|---|---|---|
| JP | 2002-186849 | 7/2002 |
| JP | 2005-294744 | 10/2005 |
| JP | 2006-83044 | 3/2006 |
| JP | 2009-193888 | 8/2009 |
| JP | 2011-241133 | 12/2011 |
| KR | 10-0198244 | 6/1999 |
| WO | WO 2011/096012 | 8/2011 |
| WO | WO 2011/125834 | 10/2011 |
| WO | WO 2012/039265 | 3/2012 |

OTHER PUBLICATIONS

M. Shapaan et al., Study of the hyperfine Structure, Thermal Stability and Electric-Dielectric Properties of Vanadium Iron Phosphate Glasses, Physica B, vol. 404, 2009, pp. 2058-2064.

Korean Office Action of Appln. No. 10-2011-138911 dated Jun. 26, 2013 with partial English translation.

Communication Pursuant to Rule 114(2) of EP Appln. No. 11194975.6 dated Sep. 3, 2012 in English.

Communication mailed Jan. 14, 2014, in connection with Chinese Application No. 201110433453.X, 7 pages.

Hirashima et al., "Electric Conductivity of Crystallized Glasses of the System $Na_2O$-$V_2O_5$-$P_2O_5$ Containing Vanadium Bronze Crystals", Yogyo-Kyokai-Shi 94(8), 1986, pp. 179-183.

* cited by examiner

THERMOELECTRIC CONVERSION MATERIAL

CLAIM OF PRIORITY

The present application claims priority from Japanese Patent Application JP 2010-286922 filed on Dec. 24, 2010, the content of which is hereby incorporated by reference into this application.

FIELD OF THE INVENTION

The present invention relates to a thermoelectric conversion material made of crystallized glass.

BACKGROUND OF THE INVENTION

The crystallization of glass is generally performed by external heating using an electric furnace or the like or by direct heating through laser irradiation or the like. For example, Japanese Patent Application Laid-Open Publication No. 2006-83044 discloses a method for forming a crystalline phase containing a rare-earth element by irradiating the surface of glass containing the rare-earth element with an ultra-short pulse laser.

Applications of microwave irradiation to various material processing have been studied, such as inorganic material synthesis, and sintering, joining and crystallization of ceramics. These applications utilize a self-heating phenomenon caused by loss of electromagnetic energy penetrating the inside of substances. Heating by microwave irradiation is a thermal processing requiring shorter time and less energy compared to general external heating because it generates heat only in a reactive component including oxides of transition metals, semiconductor substances and metallic conductive substances which exhibit microwave absorption.

Japanese Patent Application Laid-Open Publication No. 2002-186849 discloses that a synthetic precursor liquid for various inorganic materials is prepared and is continuously injected into a tube-shaped microwave reactor to be synthesized and crystallized, thereby reducing the time required in the crystallization process to a few minutes to a few tens of minutes, unlike a conventional hydrothermal method which requires longer time in the crystallization process.

Japanese Patent Application Laid-Open Publication No. 2005-294744 discloses a method for producing a photocatalyst made of anatase titanium oxide by irradiating amorphous titanium oxide with ultraviolet or visible rays having energy equal to or larger than the band gap and with microwave to heat and crystallize the amorphous titanium oxide.

When glass is crystallized by conventional external heating through heat conduction from a heat source and direct heating by laser irradiation or the like, all crystals in a thermodynamic equilibrium state are precipitated, causing a problem that even an unnecessary crystal is precipitated.

The present invention provides a thermoelectric conversion material in which only a desired crystal is selectively precipitated.

SUMMARY OF THE INVENTION

The thermoelectric conversion material in accordance with the present invention includes semiconductor glass containing vanadium and at least a part of the semiconductor glass is crystallized.

According to the present invention, a desired crystal made of a transition metal element or lithium can be selectively precipitated from glass.

DETAILED DESCRIPTION OF THE PREFERRED EMBODIMENT

Figure 1:
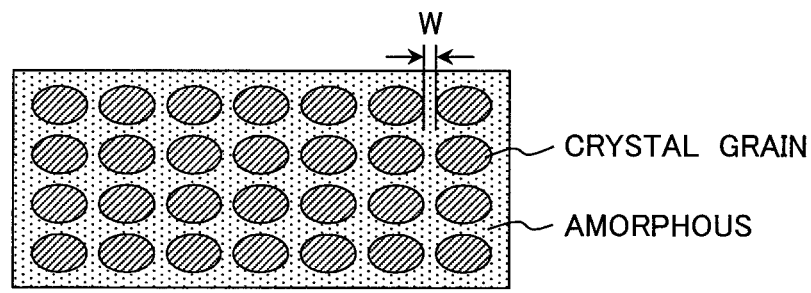
FIG. 1 is a cross-sectional view of a crystallized glass in accordance with a first embodiment.

Hereinafter, the present invention will be described in detail.

The inventors have found that heating glass containing a transition metal element by microwave allows a highly-conductive crystal or a magnetic crystal made of transition metal element to be selectively precipitated in an amorphous material. The microwave referred to herein is electromagnetic wave in the UHF to EHF bands, which has a frequency of 0.3 GHz to 3 THz and a wavelength of 0.1 mm to 1000 mm. The glass in the present invention is defined as a solid which has a random network structure of atomic arrangement and exhibits a glass transition phenomenon.

Furthermore, the inventors have found that crystallized glass, at least a part of which is crystallized by microwave heating, can be applied to a thermoelectric conversion element.

Hereinafter, an embodiment of the present invention will be described.

First Embodiment (Preparation of Glass)

$Cu_2O$, $V_2O_5$, $Fe_2O_3$ and $P_2O_5$ were dispensed in a molar fraction of 10%, 70%, 10% and 10%, respectively, and mixed to obtain 200 g of mixed powder. The mixed powder was put into a platinum crucible and heated in an electric furnace up to 1373K with a rate of temperature increase of 5 to 10K/min, and was maintained at the temperature of 1373K for one hour. The mixed powder was stirred to form uniform glass while being maintained. The platinum crucible was then taken out of the electric furnace, and the content of the crucible was poured onto a stainless plate which was heated up to 473 k to 573K in advance. The resultant coagulated material exhibited glassy luster.

(Crystallization of Glass)

The obtained glass was processed into a specimen with a size of about 10×10×2 mm, and crystallization processing by microwave irradiation and ordinary electric furnace heating was performed for the specimen under the conditions shown in Table 1.

TABLE 1

| No. | Microwave irradiation mode | Microwave output (W) Electric field | Microwave output (W) Magnetic field | Specimen temperature (K) | Processing time (min) | precipitated crystal identified by X-ray diffraction |
|---|---|---|---|---|---|---|
| 1 | Single-mode | 0 | 360 to 392 | 773 to 796 | 3 | $Cu_xV_2O_5$ (x = 0.26 to 0.59) |
| 2 | Multi-mode | 1800 | | Unmeasured | 8 | $Cu_xV_2O_5$ (x = 0.26 to 0.59) |
| 3 | Electric furnace heating | | | 748 | 480 | $Cu_xV_2O_5$ (x = 0.26 to 0.59) $V_2O_5$ |

The microwave irradiation was performed by the following two methods. The heating was performed in the air for both methods. It was found by differential thermal analysis (DTA) that the crystallization starting temperature of the glass used in the present study was 633K.

(1) Single-mode Method

Microwave with 2.45 GHz was introduced from a magnetron oscillator into a waveguide which had one end closed with a reflecting plate, and propagated in the TE10 mode. The specimen placed in the waveguide was irradiated with the microwave by the single-mode method. In order to independently control an electric field and a magnetic field at a specific position of the specimen, the specimen can be irradiated with the microwave in two systems. A strong electric field is formed at the position of the specimen by the first system of the irradiation, and a strong magnetic field is formed at the same position by the second system of the irradiation. By independently adjusting the outputs of the two systems, the output ratio of the electric field and the magnetic field was changed at the position of the specimen.

(2) Multi-mode Method

Microwave irradiation was performed using a commercially available microwave oven. Since electromagnetic wave with 2.45 GHz randomly propagates in the microwave oven, the specimen was irradiated with the electromagnetic wave from various directions.

(Identification of Precipitated Crystal by X-Ray Diffraction of Crystallized Glass)

The specimen irradiated with microwave was measured by irradiating the microwave incidence plane with X-rays using a thin-film X-ray diffraction apparatus (RINT2500HL made by Rigaku Corporation). The measurement conditions were as follows. The X-ray source was Cu, the output of which was set to be 50 kV and 250 mA. A parallel-beam optical system with a monochromator was used and a divergence slit was selected to be 0.2 mm. The scan axis of the X-ray diffraction was 2θ-single. Continuous scan was performed at a scan rate of 0.5 deg./min within a range of $5 \leq 2\theta \leq 100$ deg. and sampling was performed with a condition of 0.02 deg./step. The precipitated crystal was identified with reference to the ICDDdata, which is a collection of the standard X-ray diffraction data.

The specimen heated by the electric furnace was pulverized into a powdery form and measured using a wide-angle X-ray diffraction apparatus (RINT2500HL made by Rigaku Corporation). The measurement conditions were as follows. The X-ray source was Cu, the output of which was set to be 50 kV and 250 mA. A focused-beam optical system with a monochromator was used and a divergence slit of 0.5 deg, a receiving slit of 0.15 mm and a scattering slit of 0.5 deg were selected. The scan axis of the X-ray diffraction was 2θ/θ coupling. Continuous scan was performed at a scan rate of 0.5 deg./min within a range of $5 \leq 2\theta \leq 100$ deg., and sampling was performed with a condition of 0.01 deg./step. The precipitated crystal was identified with reference to the ICDD data.

The identification results of the specimens are shown in Table 1. In the electric furnace heating, in addition to precipitation of the desired highly conductive $Cu_xV_2O_5$ (a monoclinic system), $V_2O_5$ (an orthorhombic system), which is less conductive than $Cu_xV_2O_5$, was precipitated at the same quantity as $Cu_xV_2O_5$. In the microwave irradiation, on the other hand, only the desired $Cu_xV_2O_5$ was precipitated regardless of the irradiation mode. These results indicate that the microwave heating can selectively precipitate a highly conductive crystal from glass.

This phenomenon was caused by replacing copper (Cu) with one metal element selected from the group consisting of iron, arsenic, antimony, bismuth, tungsten, molybdenum, manganese, nickel, silver, an alkali metal and an alkaline earth metal, and $M_xV_2O_5$ crystal (M is one metal element selected from the group consisting of iron, arsenic, antimony, bismuth, tungsten, molybdenum, manganese, nickel, silver, an alkali metal and an alkaline earth metal, and 0<x<1) was selectively precipitated.

It is possible to selectively precipitate a crystal of vanadium composite oxide which has high electrical conductivity other than $M_xV_2O_5$ crystal, such as $LiV_2O_4$, $CaVO_3$, $SrVO_3$, $La_{1-x}Sr_xVO_3$, $Gd_{1-x}Sr_xVO_3$, $V_2O_3$, or $VO_2$.

(Structure Observation by SEM)

FIG. 1 is a schematic view of a cross-sectional SEM image of the glass crystallized under the heating condition of No. 1 in Table 1. The grain boundary of the precipitated crystal is amorphous having lower electrical conductivity and lower thermal conductivity than the precipitated crystal. The volume ratio of the precipitated crystal to the amorphous is preferably 70% or more. When the volume ratio of the precipitated crystal is less than 70%, the probability that the precipitated crystal is isolated from each other in the amorphous is high, resulting in drastic decrease in the electrical conductivity.

When the width (W) of the grain boundary is made not less than the mean free path of phonon and is made not more than the mean free path of electron, the thermal conductivity can be suppressed without lowering the electrical conductivity. The width W, which is a distance between crystallites and decided depending on glass composition and the type of a precipitated crystal, is preferable to be 10 nm or less.

By adjusting glass components, a crystal of metal, such as silver or copper, can be precipitated. Precipitation of a metallic crystal can increase conductivity compared to precipitation of only an oxide crystal.

(Evaluation of Thermal Characteristics)

Seebeck coefficient and electric resistivity were measured by a thermoelectric-characteristics evaluation apparatus (ZEM-3 made by ULVAC-RIKO, Inc.). Specimens were formed in a prism shape with a size of about 3×3×10 mm, and were measured with a temperature range of room temperature to 723K in low-pressure helium gas. All the specimens were measured twice under the same condition.

Figure 2:
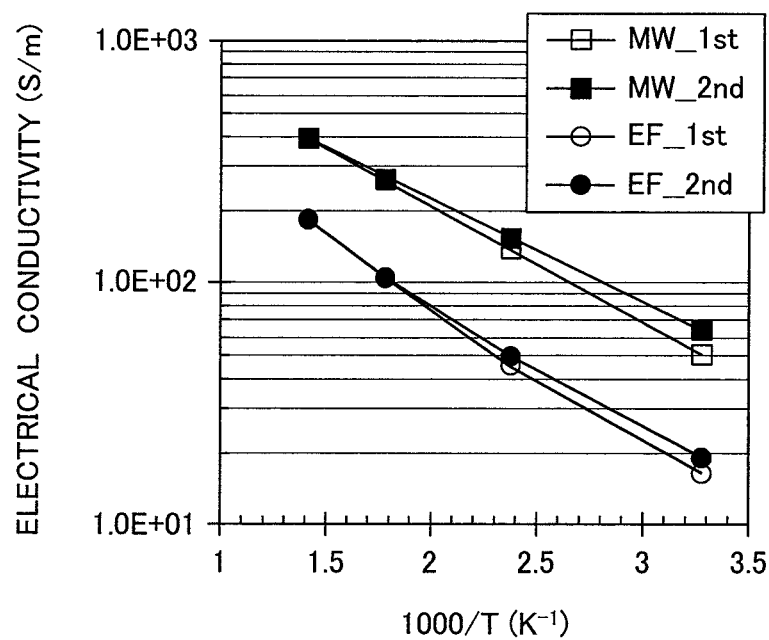
FIG. 2 illustrates a temperature dependence of the electrical conductivity of the crystallized glasses in accordance with the first embodiment.

FIG. 2 shows the temperature dependence of the electrical conductivity of the glasses crystallized under the heating conditions of No. 1 (MW) and No. 3 (EF) in Table 1. The electrical conductivity exponentially increases as the temperature rises in each case. The material heated by microwave shows higher conductivity. This result is caused by the selective precipitation of $Cu_xV_2O_5$ having higher electrical conductivity than $V_2O_5$.

Figure 3:
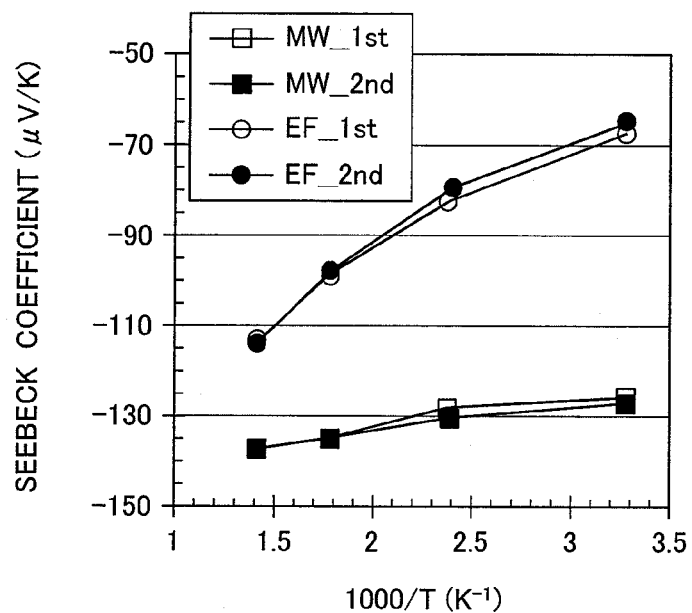
FIG. 3 illustrates a temperature dependence of the Seebeck coefficient of the crystallized glasses in accordance with the first embodiment.

FIG. 3 shows the temperature dependence of the Seebeck coefficient (thermopower, S) of the glasses crystallized under the heating conditions of No. 1 (MW) and No. 3 (EF) in Table 1. The Seebeck coefficients are negative values in all cases, indicating that the crystallized glasses are all n-type semiconductors. The absolute value of the Seebeck coefficient increases as the temperature rises in each case. The material heated by microwave shows higher Seebeck coefficient (in absolute value).

Figure 4:
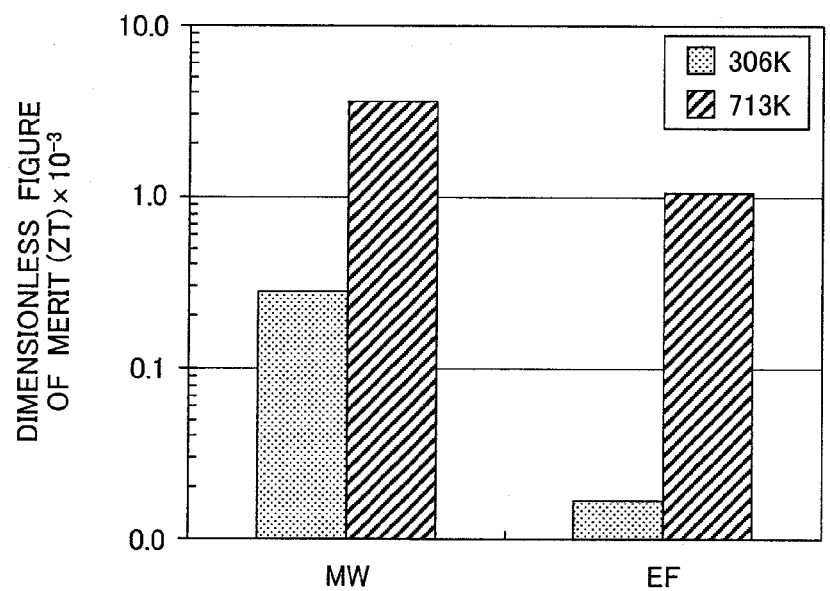
FIG. 4 illustrates a dimensionless figure of merit for the thermoelectric power of the crystallized glasses in accordance with the first embodiment.

FIG. 4 shows the result of calculation of a dimensionless figure of merit (ZT) of the thermoelectric conversion material from the electrical conductivity (σ), Seebeck coefficient (S) and thermal conductivity (κ) of the glass crystallized under the heating conditions of No. 1 (MW) and No. 3 (EF) in Table 1. The value of ZT is given by the following Equation (1):

$$ZT = \frac{S^2 \sigma T}{\kappa}. \tag{1}$$

In both cases, higher temperatures show higher ZTs. When comparing ZTs of the material heated by the electric furnace to those of the material heated by the microwave, the material heated by the microwave shows higher values, being 16 times higher at room temperature.

The vanadium-based glass prepared in the present embodiment can become either an n-type semiconductor or a p-type semiconductor by adjusting the valence of vanadium ions in the glass. Specifically, when the ratio of the number of pentavalent vanadium ions to the number of quadrivalent vanadium ions is larger than 1 ($[V^{5+}]/[V^{4+}]>1$), the glass becomes an n-type one, while the ratio is smaller than 1 ($[V^{5+}]/[V^{4+}]<1$), the glass becomes a p-type one. Depending on composition of the glass, control of the atmosphere during the crystallization process, and others, crystallized glass with either polarity is prepared.

When the polarity of the vanadium-based glass is to be made p-type ($[V^{5+}]/[V^{4+}]<1$) using an added element, an element which can reduce vanadium should be added. Specifically, at least one element should be added which is selected from the group consisting of phosphorus, iron, arsenic, antimony, bismuth, tungsten, molybdenum, manganese and nickel.

On the other hand, when the polarity of the semiconductor glass is to be made n-type ($[V^{5+}]/[V^{4+}]>1$), an element which can suppress the reduction of vanadium should be added. Specifically, at least one element should be added which is selected from the group consisting of phosphorus, copper, silver, an alkali metal and an alkaline earth metal.

An addition of any element or elements selected from those groups can not only control the polarity of the semiconductor glass but also strengthen the glass structure (enhance the stability of the glass) and improve the water resistance.

Figure 5A:
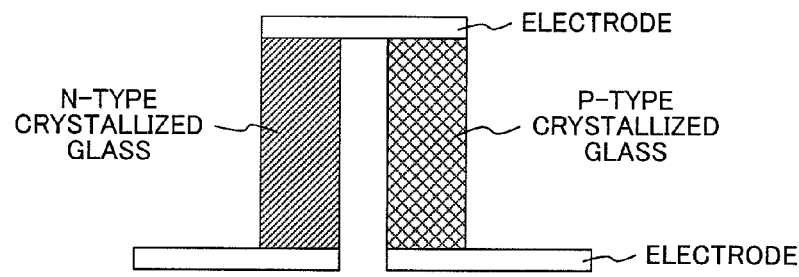
FIGS. 5A and 5B illustrate examples of a thermoelectric conversion element in accordance with the first embodiment.
Figure 5B:
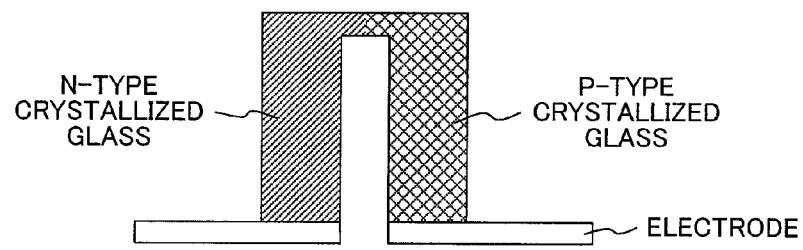

FIGS. 5A and 5B show examples of a thermoelectric conversion element in which n-type and p-type pieces of crystallized glass are electrically joined. FIG. 5A shows an example of a thermoelectric conversion element formed in a H shape via electrodes made of copper, aluminum or the like. As shown in FIG. 5B, n-type and p-type pieces of crystallized glass can be joined directly. Higher conversion efficiency can be achieved by changing either one of the n-type and p-type pieces of crystallized glass to another thermoelectric conversion material, or by combining the crystallized glass of the present invention with another thermoelectric conversion material for the thermoelectric conversion material of each polarity.

Figure 6:
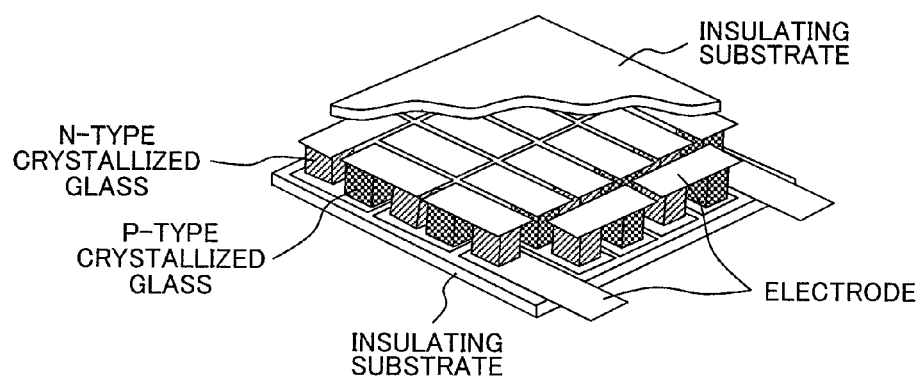
FIG. 6 illustrates an example of a thermoelectric conversion module in accordance with the first embodiment.

FIG. 6 shows an example of a thermoelectric conversion module in which the thermoelectric conversion elements shown in FIG. 5A or 5B are electrically joined. The upper and lower insulating substrates, which are provided for keeping the shape of the module, may be omitted as needed.

What is claimed is:

1. A thermoelectric conversion material comprising:
   semiconductor glass comprising vanadium,
   wherein at least a part of the semiconductor glass is crystallized, and
   wherein only $M_xV_2O_5$ crystal precipitated in the semiconductor glass, where M is one metal element selected from the group consisting of iron, arsenic, antimony, bismuth, tungsten, molybdenum, manganese, nickel, copper, silver, an alkali metal and an alkaline earth metal, and $0<x<1$.

2. The thermoelectric conversion material according to claim 1,
   wherein 70 volume percent or more of the semiconductor glass is crystallized.

3. The thermoelectric conversion material according to claim 1,
   wherein a distance between crystallites in the semiconductor glass is 10 nm or less.

4. A thermoelectric conversion element comprising:
   thermoelectric conversion materials, each of the thermoelectric conversion materials being electrically joined to another of the thermoelectric conversion materials having different semiconductor polarity,
   wherein at least a part of each of the thermoelectric conversion materials comprises the thermoelectric conversion material according to claim 1.

5. A thermoelectric conversion module comprising:
   a plurality of the thermoelectric conversion elements according to claim 4, the thermoelectric conversion elements being electrically connected to each other.

6. A thermoelectric conversion element comprising:
   the thermoelectric conversion material according to claim 1 electrically joined to another thermoelectric conversion material having a different semiconductor polarity.

7. A thermoelectric conversion module comprising:
   a plurality of thermoelectric conversion elements electrically connected to each other, wherein a thermoelectric conversion element of the plurality of thermoelectric conversion elements is the thermoelectric conversion element according to claim 6.

8. A P-type thermoelectric conversion material comprising:
   semiconductor glass comprising vanadium,
   wherein at least a part of the semiconductor glass is crystallized,
   wherein only $M_xV_2O_5$ crystal precipitated in the semiconductor glass, where M is one metal element selected from the group consisting of iron, arsenic, antimony, bismuth, tungsten, molybdenum, manganese, nickel, copper, silver, an alkali metal and an alkaline earth metal, and $0<x<1$, and
   wherein the semiconductor glass further comprises at least one selected from the group consisting of phosphorus, iron, arsenic, antimony, bismuth, tungsten, molybdenum, manganese and nickel.

9. A thermoelectric conversion element comprising:
thermoelectric conversion materials, each of the thermoelectric conversion materials being electrically joined to another of the thermoelectric conversion materials having different semiconductor polarity,
wherein at least a part of each of the thermoelectric conversion materials comprises the thermoelectric conversion material according to claim 8.

10. A thermoelectric conversion module comprising:
a plurality of the thermoelectric conversion elements according to claim 9, the thermoelectric conversion elements being electrically connected to each other.

11. A thermoelectric conversion element comprising:
the thermoelectric conversion material according to claim 8 electrically joined to another thermoelectric conversion material having a different semiconductor polarity.

12. A thermoelectric conversion module comprising:
a plurality of thermoelectric conversion elements electrically connected to each other, wherein a thermoelectric conversion element of the plurality of thermoelectric conversion elements is the thermoelectric conversion element according to claim 11.

13. An N-type thermoelectric conversion material comprising:
semiconductor glass comprising vanadium,
wherein at least a part of the semiconductor glass is crystallized,
wherein only $M_xV_2O_5$ crystal precipitated in the semiconductor glass, where M is one metal element selected from the group consisting of iron, arsenic, antimony, bismuth, tungsten, molybdenum, manganese, nickel, copper, silver, an alkali metal and an alkaline earth metal, and $0<x<1$, and
wherein the semiconductor glass further comprises at least one selected from the group consisting of phosphorus, copper, silver, an alkali metal and an alkaline earth metal.

14. A thermoelectric conversion element comprising:
thermoelectric conversion materials, each of the thermoelectric conversion materials being electrically joined to another of the thermoelectric conversion materials having different semiconductor polarity,
wherein at least a part of each of the thermoelectric conversion materials comprises the thermoelectric conversion material according to claim 13.

15. A thermoelectric conversion module comprising:
a plurality of the thermoelectric conversion elements according to claim 14, the thermoelectric conversion elements being electrically connected to each other.

16. A thermoelectric conversion element comprising:
the thermoelectric conversion material according to claim 13 electrically joined to another thermoelectric conversion material having a different semiconductor polarity.

17. A thermoelectric conversion module comprising:
a plurality of thermoelectric conversion elements electrically connected to each other, wherein a thermoelectric conversion element of the plurality of thermoelectric conversion elements is the thermoelectric conversion element according to claim 16.

* * * * *